United States Patent [19]

Aubert

[11] Patent Number: 4,812,765
[45] Date of Patent: Mar. 14, 1989

[54] METHOD OF ADJUSTING THE HOMOGENEITY CORRECTORS OF THE MAGNETIC FIELD CREATED BY A MAGNET

[75] Inventor: Guy Aubert, Grenoble, France

[73] Assignee: Centre National de la Recherche Scientifique, Paris, France

[21] Appl. No.: 48,731

[22] Filed: May 11, 1987

[30] Foreign Application Priority Data

May 13, 1986 [FR] France ............... 86 06861

[51] Int. Cl.$^4$ ............................................. G01R 33/20
[52] U.S. Cl. ................................ 324/320; 324/318; 364/571.02
[58] Field of Search ............... 324/318, 319, 320, 312; 335/216; 364/571

[56] References Cited

U.S. PATENT DOCUMENTS 4,656,447  4/1987  Keim et al. ................ 324/320
4,680,551  7/1987  O'Donnell et al. ......... 324/320

FOREIGN PATENT DOCUMENTS 0179370  4/1986  European Pat. Off. .
2567648  1/1986  France .
2155642  9/1985  United Kingdom .

OTHER PUBLICATIONS

Magnetic Resonance in Medicine, vol. 1, No. 1, Mar. 1984, pp. 44-65, Academic Press, Inc., New York, U.S.; F. Romeo et al, "Magnet Field Profiling: Analysis and Correcting Coil Design."

Primary Examiner—Stewart J. Levy
Assistant Examiner—Kevin D. O'Shea
Attorney, Agent, or Firm—Oblon, Fisher, Spivak, McClelland & Maier

[57] ABSTRACT

A method is provided for adjusting the homogeneity correctors of the magnetic field created by a magnet. In the invention an analytic expression of the field is calculated in the form of a breakdown into spherical harmonics. Similar breakdowns into spherical harmonics are also calculated but relative to the field created by each of the correction means available for correcting this field. Then an algebraic combination is made of the analytic expressions of the correction means so as to produce a correction analytic expression which, added to the analytic expression of the real field, transforms it into an analytic expression corresponding to an ideal magnetic field. Then the correction means are adjusted as a function of the parameters of the algebraic combination.

6 Claims, 1 Drawing Sheet

U.S. Patent                    Mar. 14, 1989                    4,812,765
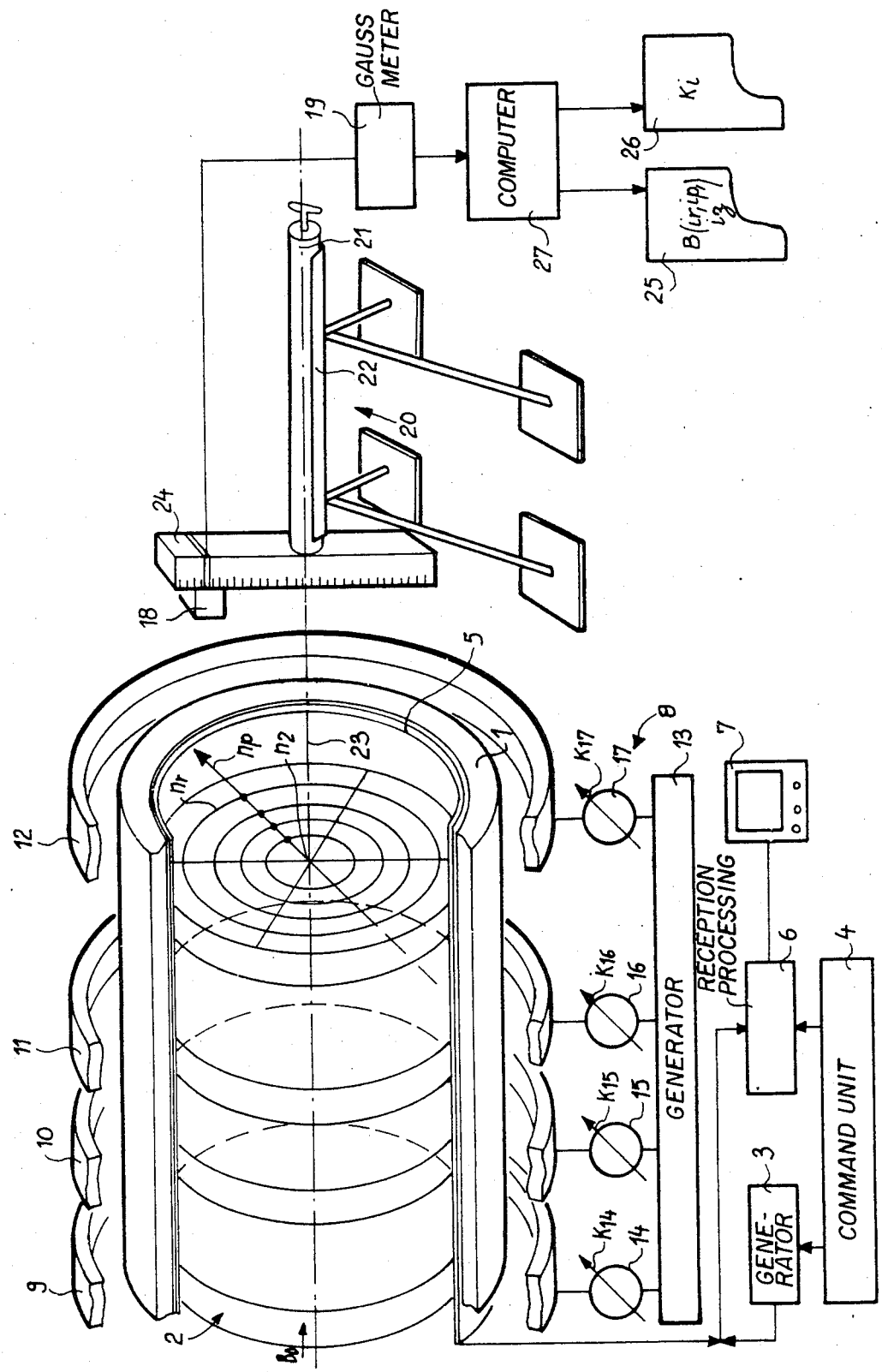

METHOD OF ADJUSTING THE HOMOGENEITY CORRECTORS OF THE MAGNETIC FIELD CREATED BY A MAGNET

BACKGROUND OF THE INVENTION

The present invention is due to the collaboration of the Service National des Champs Intenses (Director Mr. Guy AUBERT) and it relates to a method of adjusting the homogeneity correctors of the magnetic field created by a magnet. It finds its application particularly in the medical field where magnets are used for carrying out non invasive investigations by applying nuclear magnetic resonance image forming methods. It may nevertheless find its application in other fields, particularly in that of scientific research where intense fields produced by magnets are used.

1. Field of the Invention

Nuclear magnetic resonance is a phenomenon of oscillation of the magnetic moment of the nuclei of the atoms or molecules of a body at a frequency which depends on the intensity of a magnetic field in which this body bathes. It follows from this statement that if the magnetic field varies, the frequencey of the resonance phenomenon varies also. Thus, for technological and technical reasons, in such experimentation, it is of the highest importance for the field produced by the magnet to be very homogeneous in its zone of interest. The required homogeneity is generally of the order of a few parts per million in the medical field, even of a few parts per billion in the scientific field. With this end in view, attempts have been made to construct magnets giving the most perfectly homogeneous field.

Unfortunately, whatever the care taken in the construction of the magnets, their construction is never as perfect as the theory which led to their calculation. Moreover, even if this defect can be removed, the magnet must materially be placed in a given position in order to be used. Now, none of the regions in space on earth, in an industrial or urban environment, is totally free of disturbing magnetic elements. The result is that, once installed on the site, the field produced in the useful zone of a magnet presents inhomogeneities which it is now necessary to try and correct.

2. Description of the Prior Art

The principle in correcting field inhomogeneities is that of superimposition: coils, magnetic pieces or any other means for producing magnetic fields are added so as to correct the imperfections of the main field and so as to produce an overall homogeneous field. The theory of the correction was originally developed by Messrs. SAUZADE M. and KAN S. K. in the review "Advances in Electronics and Electron Physics", vol. 34, 1973 Academic Press and their work is recounted in the collection of "Techniques de l'Ingènieur" chapter E 4351. The authors started from the principle that a magnetic field, at any point in space, may be expressed mathematically in the form of a so called analytic expression of the type $B_Z(x,y,z)=f(x,y,z)$. In this expression $B_Z$ represents the main component of the field at a coordinate point $x,y,z$ and $f$ is the analytic function used. The function $f$ that these authors explained is written in the form of a polynomial breakdown into $x,y,z$ of order or power increasing from 0 to infinity. Under certain restrictions, particularly the nearness of the regions concerned to the correction means which modify the field thereof, the high order terms of this expression may be neglected.

These authors were able to derive from this breakdown a general principle of independence of the corrections. This independence means that it is possible to construct correction means acting on the higher orders, but not on the lower, within a given order. For example, on pages 4–6 of the above mentioned collection, these authors describe a series of 12 coils for correcting successively field inhomogeneities up to the orders 4 of the analytic expression in question. Thus, for example after correcting the first order inhomogeneities of the main field with a first coil designed for this purpose, second order inhomogeneities of the main field may be corrected, to which are added meanwhile second order inhomogeneities due to the first coil, by means of a second correction coil. The purpose of this second coil is to correct the second order inhomogeneities but not to produce first order inhomogeneities. And so on, the correction is made successively for all the orders. For the adjustment, after each correction, before passing to the next correction, the field is remeasured. Then the correction to be made is estimated by comparing the field value defects at measuring positions with fields which may be obtained with the next coil. This procedure is laborious, it only gives good results after numerous attempts. Moreover, the adjustment is never achieved under the best conditions.

In their complexity, the theory and adjustment are simplified by a possibility of differenciation between so called axial corrections, those which correspond to the variations of the main field which are met with moving parallel to this field in the useful zone, and so called radial corrections which correspond to the inhomogeneities which are met with when moving perpendicularly to the orientation of this main field. It is clear from this study that the axial and radial corrections are independent of each other, at least if only the component of the main field oriented in the desired orientation of this field is taken into account. The above mentioned authors thus constructed, in one example, 12 coils adapted for forming a complete correction system. This system is universally known. It is used by many constructors.

More recently, Mrs. F. ROMEO and Mr. D. I. HOULT published in the review Magnetic Resonance in Medicine 1, 44–65 of 1984 an article entitled "Magnetic Field Profiling: Analysis and Correcting Coil Design". The work of these authors is complementary to that of the first ones. They show in particular that for the analytic expression of the field the polynomial breakdown based on carthesian coordinates is not the best. On the contrary, the sperical coordinates which lead to an analytic expression of the field in the form of a combination of spherical harmonics are more propitious to the understanding aand formation of typical structures for correction means to be constructed. The latter authors further teach a correction methodology. This methodology includes the following steps: first of all the main field to be corrected is measured. This result may be obtained using convetional means. Once measured, an a analytic expression therefor is sought in the preferred form. From this analytic expression, which is compared with an ideal analytic expression (representing an ideal field corresponding, for example to a constant $B_Z$), is derived the analytic expression of a corrector field to be produced. Finally, by considerations similar to those which prevailed for the preceding authors, it is proposed to construct coils, or any other correction means, so as to reach the desired homogeneity of the main field. This erudite methodology has however a major drawback: it is not industrial. In fact, it assumes that the correction systems must be calculated, manufactured and installed specifically for each magnet. Technically and financially this methodology is inapplicable outside the laboratory. On the one hand because it corresponds to a new craft not yet represented in industry: that of calculating and constructing correction coils on request; and on the other hand because even in this case the cost and time spent in such constructions would be prohibitive.

SUMMARY OF THE INVENTION

The object of the present invention is to overcome the above mentioned drawbacks by proposing a method which perfects these two teachings in order to make them more efficient and more industrial. With the adjustment method of the invention, it is possible to adjust the homogeneity of a magnet in a few hours whereas it requires a few days with the first reference cired above. Moreover, for making the adjustment, standard and not specialized correction means are used. These means, which may be coils, are only independent, in the meaning of the invention, for the correction orders which they deal with. The method of the invention is even such that it is possible to adjust the field of a magnet when this magnet is provided with correction means whose structure is not known and on which action can be taken only through their controls.

The present invention provides then a method of adjusting the homogeneity correctors of a magnetic field created by a magnet, including the following phases:

the real field created by the magnet is measured, the analytic expression of the measured field is calculated over a base of orthogonal functions, the analytic expressions of the fields produced by the correction means as a function of their adjustment state are calculated over the same base, the analytic expression of an ideal field to be obtained with the magnet is calculated over the same base, an algebraic combination is made of the analytic expressions of the correction fields so as to make it equal, and, of opposite sign, to the difference of the analytic expressions of the real and ideal fields, and the correction means are adjusted as a function of the results of this algebraic combination.

DESCRIPTION OF THE PREFERRED EMBODIMENT OF THE INVENTION

The invention will be better understood from reading the following description with reference to the accompanying FIGURE. This description is given solely by way of indication and is in no wise limitative of the invention. In particular, the application to the medical field is not restrictive.

The single FIGURE shows schematically in perspective a nuclear magnetic resonance image forming apparatus of the type used for example in the medical field. A magnet 1 produces therein an intense field $B_0$ in a useful volume 2 here of a circular cylindrical form. Generating means 3 under the control of a control unit 4 are provided for supplying means 5 providing the radio frequency energization and the spatial differentiation of the magnetic moment of particles placed for examination in volume 2. Means 5, particularly in their radio frequency aspect, are also used for measuring a de-energization wave representative of the magnetic resonance phenomenon. They are connected to means 6 for receiving and processing the measured signal. Means 6, also under the control of control means 4, may produce sectional images of the body examined. These images may be displayed on display means 7.

In accordance with the teaching recommended by the two references, this system further includes a correction means assembly 4 including in particular, in one example, a number of coils schematically shown such as 9, 10, 11, etc 12. These coils are fed with current by a generator 13 through controls for adjusting the intensity of the current, respectively 14 to 17. Controls 14 to 17 serve for adjusting the correction means. As mentioned above, means 8, in the invention, may be standard means (generally correcting coils 12 in number) or specialized. The structure of these means, of these coils, may be known or even unknown by the operator who will carry out their adjustment in accordance with the teaching of the invention.

By means of a probe 18 connected to a gaussmeter 19 and supported by a scanning device 20, the real field created by magnet 1 in volume 2 is measured. The scanning device 20 includes schematically a shaft 21 which may slide and rotate on itself in a bearing 22. The axis of shaft 21 is aligned with the axis 23 of the circular cylindrical volume 2. At the end of shaft 21 is mounted a transverse scale 24 on which probe 18 may be fixed. Depending on the rotational position of shaft 21, scale 24 is oriented in one of np possible directions. The height of the position of probe 18 on scale 24 may be taken from nr possible positions. Finally, shaft 21 may slide in support 22 so that the probe may be located at nz abscissa along axis 23. A triplet of numbers ir, ip and iz thus represent the cylindrical coordinates of any point of volume 2 where probe 18 may be placed, and for which the real field $B_0$ is measured. In the invention, the measurements made with the gaussmeter 19 are fed into a computer 27 which edits them in a list 25. In the application of the method of the invention, computer 27 may also edit a list 26 of indications $K_i$ of the adjustment values for the adjustment controls 14 to 17.

When the measurements corresponding to list 25 are known, the analytic expression of field $B_0$ may be calculated, in the preferred form of a breakdown into spherical harmonics, by means of appropriate software using in particular the teaching mentioned in the second reference cited. Also, any other system used for expanding, such as cylindrical harmonics, may also be utilized. These spherical harmonics have the feature of being orthogonal. this analytic expression may then be written in the following way:

$$\frac{B_z(r,\theta,\phi)}{B_s} = H_0 + \sum_{n=1}^{\infty} \left(\frac{r}{r_o}\right)^n [H_n P_n (\cos\theta)] +$$

$$\sum_{n=1}^{\infty} \left(\frac{r}{r_o}\right)^n \left[\sum_{m=1}^{m=n} J_n^m \cos m\phi \sqrt{\frac{(n-m)!}{(n+m)!}} P_n^m (\cos\theta)\right] +$$

$$\sum_{n=1}^{\infty} \left(\frac{r}{r_o}\right)^n \left[\sum_{m=1}^{m=n} J_n^m \sin m\phi \sqrt{\frac{(n-m)!}{(n+m)!}} P_n^m (\cos\theta)\right]$$

In this formula $B_z$ is the component along axis 23 of the field $B_0$ created by magnet 1, $B_s$ is a reference field for defining coefficients $H_n$, $I_n^m$ and $J_n^m$ without dimension. The reduced radius $r/r_o$ measures the modulus of the distance r from any point of the useful volume to the radius r of the useful sphere. The functions $P_n(\cos\theta)$ and $P_n^m(\cos\theta)$ are respectively the Legendre's polynomials and Legendre's polynomials associated with indices n and m. The coefficients $H_n$, $I_n^m$ and $J_n^m$ are representative of the field $B_0$: for a measured field $B_z$ they are known. In practice, the computer 27 may be programmed for carrying out this calculation from the measurements. The exact correspondance is preferably used which exists between the spherical coordinates r, $\theta$ and $\gamma$ of the analytic expression and the triplet of numbers ir, ip and iz which served for measurement of the field.

In the invention it has been noticed that if it were possible to know the analytic expression of the main field $B_0$, it was also possible to know the analytic expression of the field produced by any one (1 to 12) of the correction means 8. It is therefore possible to write the field relative to each of these means in the form of an analytic expression similar to that seen above and parametered each time by a coefficient $k_i$: $K_{14}$ to $K_{17}$. This coefficient, in the case of coils, is proportional to the current which flows through them. Furthermore, it is also possible to calculate the analytic expression, for example also in accordance with a breakdown into spherical harmonics, of an ideal field to be obtained and which would correspond for example to a constant $B_z$.

The subtraction of the real analytic expression from the ideal analytic expression, corresponding for example to a constant $B_z$, gives a correction analytic expression. This correction analytic expression as well as the analytic expressions, parametered by $K_i$, of the correction magnetic fields may be written concordently. For example, all the coefficients $H_n$, $I_n^m$, $J_n^m$ of the correction field will bear an index cor; the same coefficients corresponding to the controls (14 to 17) will include indices i where i may have a value from 1 to N, N being the number of controls. When the fields produced by the correction means is equal, and of opposite sign, to the correction field, it may be written that the correction analytic expression is equal, and of opposite sign, to an algebraic combination of the analytic expressions (multiplied each time by coefficients $K_i$) of the fields produced by the correction coils. This may again be written in the following way:

$$EA_{cor.} = -\sum_1^N K_i \cdot EA_i$$

where EA signifies the analytic expression. In the invention, it was then noticed that this equality led to a plurality of equalities or equations of the form:

$$H_{ncor.} = -\sum_1^N K_i \cdot H_{ni}$$

$$I_{ncor.}^m = -\sum_1^N K_i \cdot I_{ni}^m$$

$$J_{ncor.}^m = -\sum_1^N K_i \cdot J_{ni}^m$$

where n and m may be any number (between 1 and infinity) sine the functions $P_n$ and $P_n^m$ are independent. In this system of equations the unknowns are $K_i$. For a given value of N (N=12 in the first state of the art cited), this system of equations cannot admit of a solution if n or m may be infinite. In fact, this leads to an infinity of independent equations with a limited number (N) of unknowns. On the other hand, by keeping a possibility of tolerance on the result to be attained. It may be admitted that beyond a certain order the equations will no longer be verified. For example, it may be admitted that beyond n=4, the coefficients of the analytic expression of the correction fields as well as those of the correction means are sufficiently low to be neglected. The result is then that we may be confronted with a system of equations including a given number N of equations and the same given number N of unknowns. Such a system, known mathematically under the name of CRAMER system is solvable. The solution which may include more particularly a matrix inversion operation, is typically of the kind which may be carried out by computer 27.

Thus it follows that, knowing all the coefficients of breakdown into spherical harmonics related to the correction field and related to each (i) of the correction means, it is possible to find simply the list of values $K_i$ for adjusting these means. In the case of coils, the values $K_i$ are proportional to the currents which flow through each of the coils. It will however be understood that this statement will not be true if, instead of having a number N of independent correction coils, we had N times the same coil. This impossibility is expressed in other terms by stating that it is necessary, for a solution to be found in accordance with the calculating method of the invention, for the correction coils to produce fields which, with regard to the breakdown into spherical harmonics (at least for the first orders concerned), may be considered as algebraically independent. The result of this independence is, for example, that it must be impossible to reproduce the field of any coil with an algebraic combination of the fields produced by the other correction coils, at least for the first orders considered. However, it can be appreciated that this additional constraint of independence in the invention is very simple to achieve and is much less constraining than that corresponding to the state of the art cited; in this latter, in fact, it is expressed differently, but even so it is expected of a coil correcting inhomogeneities at a given order that it does not induce inhomogeneities at a lower order (or else that a coil correcting radial inhomogeneities does not induce axial inhomogeneities and vice versa).

The knowledge of the breakdown into spherical harmonics of the field of each of the correction coils may be known in different ways. By knowing the structure of the correction coils and by following the teaching of the second state of the art cited, it is possible to calculate the analytic expression of the theoretic field which they produce. In fact, these coils, like the magnet to be corrected, do not produce a theoretic field but a real field slightly different from the theoretic field. The result is a difference in the analytic expression which corresponds to this real field. If it is assumed that the main field has inhomogeneities of the order of a thousandth, the nominal field produced by the correction means must be of this order of size. Constructed with the same care as the magnet, the correction means then have defects of the same order. Consequently, the inhomogeneities of the correction fields are themselves a thousandth of a thousandth, that is to say of the order of a millionth of the main field. Under these conditions, in a first approach, they may be neglected and the analytic expression of the theoretic field may be used.

However if such is not the case, or, in a particularly interesting case if the structure of the correction means is not known, it is possible to calculate the analytic expression of the field which each of them produces. For example, for coils, a nominal current, proportional to a coefficient Ko, is caused to flow through them in turn, and the real field which they produce is measured. Then, in the same way as the for main field, the analytic breakdown to which this field corresponds is calculated. The present invention thus teaches, that, whatever the existing correction means and provided that they are independent in the meaning of the invention, it is possible to remedy the inhomogeneities when the analytic expression thereof has been calculated.

Another advantage of the method consists in indicating with what geometric accuracy the scanning of volume 2 must be conducted, as well as the order of the field analytic expressions which must be used for reducing the inhomogeneities to a given value. The number of measuring points is equal to P where:

$$P = nz(1 + (nr-1)np)$$

In practice, it is provided fo nz to be an uneven number so that one of the abscicssa corresponds to the center of the useful volume 2. For known nz, nr and np, the field may then be recorded at P points and its analytic expression calculated. This expression is necessarily limited to a given order. Knowing this analytic expression, the theoretic field to which it corresponds is calculated. This theoretic field is different from the real field measured since the upper orders have been neglected in the analytic expression. Then the mean quadratic difference is calculated between the real field measured and the theoretic field calculated. If this means the quadratic difference is greater than the measuring accuracy of the gaussmeter 19 (or also than the desired homogeneity tolerance), it is deduced therefrom that the analytic expression is incorrect. It may be incorrect for two reasons. Firstly, because the number of measuring points is insufficient, secondly, and correlatively, because the order of breakdown into spherical harmonics is also insufficient. In this case nz, nr, np and the breakdown order should be increased until the mean quadratic difference is of the order of or less than the desired accuracy.

The spherical harmonic breakdown teaches us that m must be less than or equal to n. Knowing that m appears therein in the natural functions in the form of cos m and sine m, the result is that the limitation to a given number of the number np limits the number n. In fact, the radial scanning in a given number np of privileged directions is identical to sampling, and by applying Shannon's theory, it is known that natural sine m and cos m functions cannot be validly defined where m is greater than the whole part of np/2. Mathematical and physical considerations of the same kind lead to a choice of n which is maximum and equal to (nr+nz−2). Thus, knowing nr, np, nz and so p, the upper order of the analytic expession can be deduced therefrom. The increase of one causes that of the other. In one example, for a cylindrical useful volume whose diameter, equal to the length, has a value of the order of 50 cm, it has thus been discovered that knowledge of the field at 451 points (nr=6, np=8, nz=11) allows the field with spherical harmonics to be expressed analytically up to the order n=15 and m=4 with a mean quadratic difference of one part per million.

The present invention, although described in a solution where the adjustment is simple (by adjusting the current in the correction coils) is however not limited to this application. In particular, it is possible to use permanent magnet pieces of appropriate shapes, dimensions and magnetization as well as magnetizable pieces (made from soft iron) of chosen shapes, dimensions and magnetic susceptibility. These magnetic or magnetizable "shims" are placed in the vicinity of the magnet. They exert their influence mainly in the useful volume 2. The adjustment may be exerted in any form but is preferably obtained by modifying the orientation of these shims. Such constructions are described in patent application Ser. No. 048,732 filed May 11, 1987; In this case, the parameters $K_i$ must be replaced by parametrization functions; These parametrization functions correspond to changes in the orientation of the magnetic shims. The notion of algebraic combination of the analytic expressions, claimed above, extends also to this case. It means in fact the algebraic combination of the terms of the analytic expressions. In fact, these terms are parametered therein as a function of the aiming of the shims.

What is claimed is:

1. A method of adjusting the homogeneity correctors of the magnetic field created by a magnet, including the following phases:

the real field created by the magnet is measured, the analytic expression of the measured real field is calculated over a base of N orthogonal functions, this analytic expression being expanded as a summation of N orthogonal components each component being the result of the multiplication of one of said orthogonal function by a specific coefficient, the number of these specific coefficients being equal to N, said N specific coefficients representing said real field, the analytic expressions of fields produced by N correction means as a function of their adjustment state are calculated in a same manner over the same base, the analytic expression of an ideal field to be obtained with the magnet is calculated in a same manner over the same base, an algebraic combination is made of the analytic expressions of the correction fields so as to make it equal, and of opposite sign, to the difference of the analytic expressions of the real and ideal fields, said algebraic combination comprising a step of giving a solution to a system of N equations related to the N orthogonal functions, with N unknowns, said N unknowns being each in correspondence to a particular correction means of said N correction means, and the N correction mean are adjusted as a function of the results of this algebraic combination.

2. The method as claimed in claim 1, wherein, for calculating the analytic expression of the fields produced by the correction means, the field which each of these means produces in a given state of adjustment is measured.

3. The method as claimed in one of claims 1 or 2, wherein, for calculating the analytic expressions, the breakdown into spherical harmonics of the fields produced is measured.

4. The method as claimed in any one of claims 1 or 2, wherein, for calculating the analytic expressions of the fields, the breakdown into cylindrical harmonics of the fields produced is calculated.

5. The method as claimed in any one of claims 1 or 2, wherein for measuring the field, a measuring probe is moved to a certain number of points distributed cylindrically inside a useful volume.

6. The method as claimed in claim 5, wherein after calculating the breakdown into spherical harmonics of the measured field, the magnetic field corresponding to this breakdown is calculated, the magnetic field calculated is compared with the magnetic field measured, from this comparison are deduced the minimum number of measuring points and the minimum order of the breakdown compatible with the accuracy of the measuring apparatus used for making the measurement and/or with the tolerance to be respected to the real field.

* * * * *